United States Patent [19]
Dersch

[11] Patent Number: 4,988,669
[45] Date of Patent: Jan. 29, 1991

[54] ELECTRICAL CONDUCTOR IN WIRE OR CABLE FORM COMPOSED OF A SHEATHED WIRE OR OF A MULTIPLE-FILAMENT CONDUCTOR BASED ON A CERAMIC HIGH-TEMPERATURE SUPERCONDUCTOR

[75] Inventor: Helmut Dersch, Würenlos, Switzerland

[73] Assignee: Asea Brown Boveri Ltd., Baden, Switzerland

[21] Appl. No.: 371,296

[22] Filed: Jun. 26, 1989

[30] Foreign Application Priority Data

Jul. 5, 1988 [DE] Fed. Rep. of Germany ....... 3822684

[51] Int. Cl.$^5$ .......................................... H01B 12/00
[52] U.S. Cl. .................................... 505/1; 174/125.1; 505/704; 505/887
[58] Field of Search .................. 174/125.1; 505/704, 505/740, 884, 887, 1

[56] References Cited

U.S. PATENT DOCUMENTS

| | | | |
|---|---|---|---|
| 3,652,967 | 3/1972 | Tanaka et al. | 174/125.1 X |
| 3,710,000 | 1/1973 | Shattes et al. | 174/125.1 |
| 3,767,842 | 10/1973 | Bronca et al. | 174/125.1 X |
| 4,785,142 | 11/1988 | Smith, Jr. et al. | 174/125.1 X |

FOREIGN PATENT DOCUMENTS

8802355 4/1988 World Int. Prop. O. .

OTHER PUBLICATIONS

Tebble, R. S. et al.; *Magnetic Materials;* Wiley-Interscience; pp. 114–117; 10/12/63.
West, E. G.; *Copper and Its Alloys;* Ellis Horwood Limited Publishers; Halsted Press, Division of John Wiley and Sons; pp. 118–121 (no date).
Weldon, B. A. et al.; Nickel Silver As An Engineering Material; *Copper and Its Alloys;* Proceedings International Conference by Institute of Metals, Amsterdam, Sep. 21–25, 1970; pp. 298–302.
Table 5.3.0–MAI; American Low Temperature Materials handbook; Nov. 75.
S. Jin et al., "High Tc Superconductors-Composite Wire Fabrication", Appl. Phys. Lett. 51 (3), Jul. 20, 1987, pp. 203–204.
Siemens-Zeitschrift 6/87, pp. 34–37, "Supraleitung bei hoheren Temperaturen".
S. Jin et al., "Fabrication of Dense $Ba_2YCu_3O_{7-\delta}$ Superconductor Wire by Molten Oxide Processing", Appl. Phys. Lett. 51 (12), Sep. 1987, pp. 943–945.
Journal of Metals, May 1987, pp. 8–10, "Breakthroughs in Superconductivity", F. M. Mueller.
Jap. Jour. of Appl. Physics, vol. 26, No. 12, Dec. 1987, pp. L2085–L2086, H. Katayama-Yoshida et al.
Jap. Jour. of Appl. Physics, vol. 27, No. 2, Feb. 1988, pp. L191–L194, Jin Seong Park et al.
T. Kawai and M. Kanai, "Preparation of High-Tc Y-Ba-Cu-O Super-Conductor", Jap. Jour. of Applied Physics, vol. 26, No. 5, May 1987, pp. L736–L737.
Y. Yamada et al., "Critical Current Density of Wire Type Y-Ba-Cu Oxide Superconductor", Jap. Jour. of Applied Physics, vol. 26, No. 5, May 1987, pp. L865–L866.
H. Yoshino et al., "Superconducting Wire and Coil with Zero Resistance State at 90K and Current Density of 510 A/cm$^2$ at 77K", Toshiba Corporation.

*Primary Examiner*—Morris H. Nimmo
*Attorney, Agent, or Firm*—Oblon, Spivak, McClelland, Maier & Neustadt

[57] ABSTRACT

Electrical conductor in wire or cable form composed of a sheathed wire or of a multiple-filament conductor based on a ceramic high-temperature superconductor of the $REBa_2Cu_3O_{6.5+y}$ type, RE being = rare-earth metal, $0 < y < 1$, or of the $(La,Ba,Sr)_2CuO_4$ type, as core (1) and of a metal sheath (3) as mechanical support and emergency current conductor, the core (1), clad with metal sheath (3), of each filament of the electrical conductor composed of a multiplicity of filaments being embedded on all sides in a soft magnetic material (4) of high permeability.

8 Claims, 2 Drawing Sheets

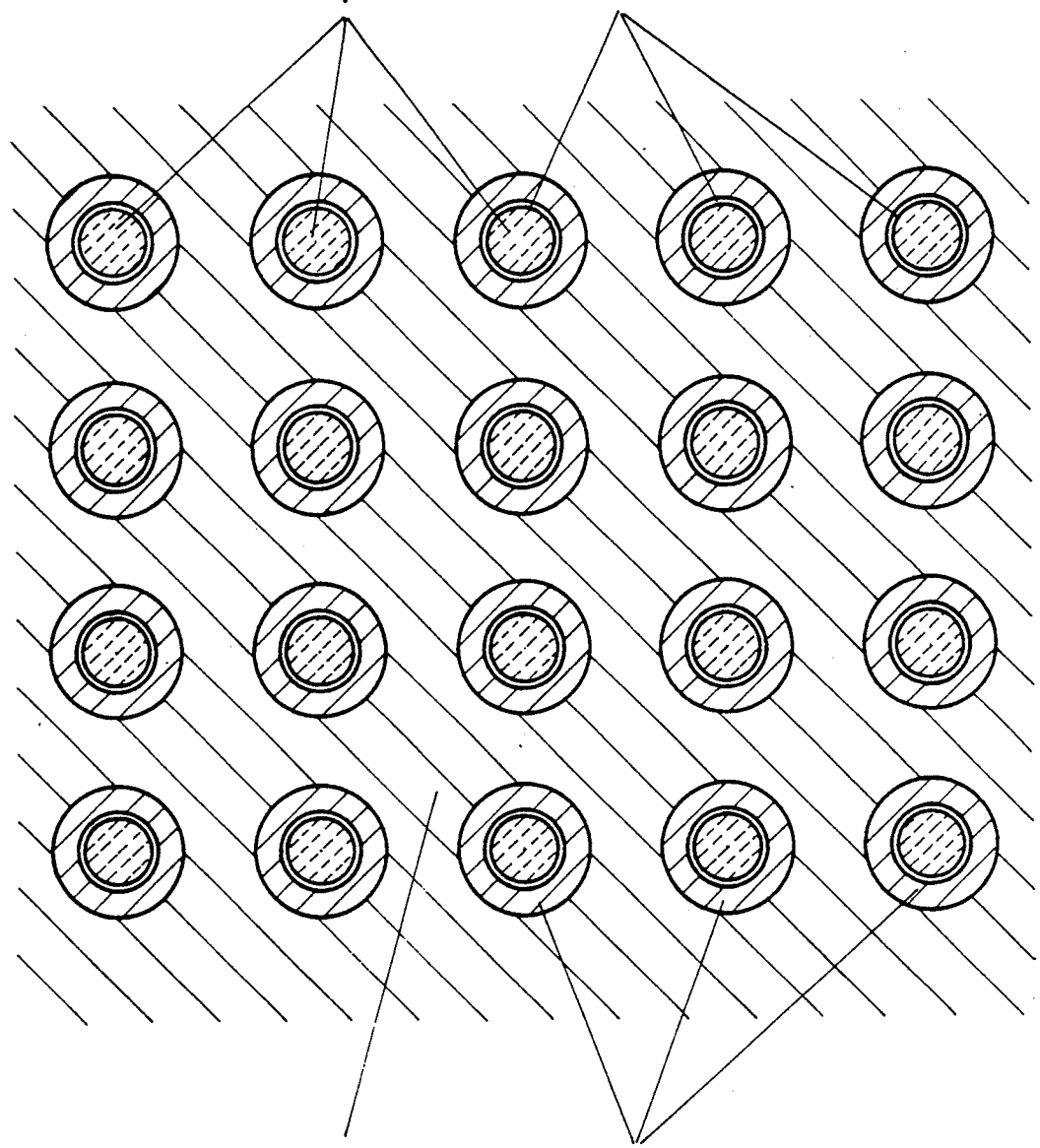

ELECTRICAL CONDUCTOR IN WIRE OR CABLE FORM COMPOSED OF A SHEATHED WIRE OR OF A MULTIPLE-FILAMENT CONDUCTOR BASED ON A CERAMIC HIGH-TEMPERATURE SUPERCONDUCTOR

BACKGROUND OF THE INVENTION

1. Field of the Invention

The technology of electrical superconductors. Very recently the importance of materials which have superconducting properties has been constantly increasing. The discovery of new superconducting materials, in particular of the rare earth/Ba/Cu/O type resulted in an appreciable extension of the possible applications for superconductors since these substances become superconducting even at temperatures above 50K.

The invention relates to the further development and improvement of components composed of a ceramic high-temperature superconductor in wire form, it being intended to give consideration to the requirements of industrial mass production.

In particular it relates to an electrical conductor in wire or cable form composed of a sheathed wire or of a multiple-filament conductor based on a ceramic high-temperature superconductor of the $REBa_2Cu_3O_{6.5+y'}$ type, RE denoting a rare-earth metal and $0 < y < 1$, or of the $(La, Ba, Sr)_2CuO_4$ type and the said superconductor being arranged as core in a metal sheath serving as mechanical support and emergency current conductor.

2. Discussion of Background

It is known to produce superconductors of the $REBa_2Cu_3O_{6.5-7}$ type by preparing and mixing powders of the starting materials and subsequently heat treating them. The starting materials used are, as a rule, $Y_2O_3$/$CuO$ and $BaO$ or $BaCO_3$. In the case of $BaCO_3$, the $CO_2$ has to be expelled by an additional calcination process (cf. T. Kawai and M. Kanai, "Preparation of high-Tc Y—Ba—Cu—O Superconductor", Jap. Jour. of Applied Physics, vol. 26, No. 5, May 1987, pp. L736–L737; Y. Yamada, N. Fukuschima, S. Nakayama and S. Murase, "Critical current density of wire type Y—Ba—Cu oxide superconductor", Jap. Jour. of Applied Physics, vol. 26, No. 5, May 1987, pp. 2865–2866). In that case, sintering is carried out in an atmosphere (air) containing oxygen, that is to say under a certain $O_2$ partial pressure. The surrounding sintering atmosphere thereby makes its contribution to achieving a slightly superstoichiometric oxygen content of the compound. It has already also been proposed to carry out the sintering process in a narrow silver tube. Silver is permeable to elementary oxygen so that the latter gets into the core material by diffusion (cf. H. Yoshino, N. Fukushima, M. Niu, S. Nakayama, Y. Yamada and S. Murase, "Superconducting wire and coil with zero resistance state at 90K and current density of 510 A/cm² at 77 K", Toshiba Corporation, R+D Centre, Saiwai-Ku, Kawasaki City 210, Japan).

Ceramic high-temperature superconductors are remarkable for a relatively low critical current density, which is an obstacle to their general use. Apparently, even weak magnetic fields are sufficient to disable the superconduction. For this purpose, for example, even the self-magnetic field of the current-carrying conductor is sufficient. Ceramic material at present available is always limited by this self-field effect.

SUMMARY OF THE INVENTION

Accordingly, one object of the invention is to provide a novel electrical conductor in wire or cable form based on a ceramic high-temperature superconductor which has an as high as possible current-carrying capacity and in which the harmful effect of the self-magnetic field is largely suppressed to the critical current density $J_{crit}$. The conductor should be capable of being manufactured in a simple manner with reproducible physical properties and having large linear dimension.

This object is achieved in the conductor mentioned in the introduction wherein the core, provided with the metal sheath, of each filament of the electrical conductor, which is resolved into a plurality of filaments, is embedded in a soft magnetic material of high permeability.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein FIG. 2 shows a diagrammatic cross section through a multiple-filament conductor.

DESCRIPTION OF THE PREFERRED EMBODIMENTS

Figure 1:
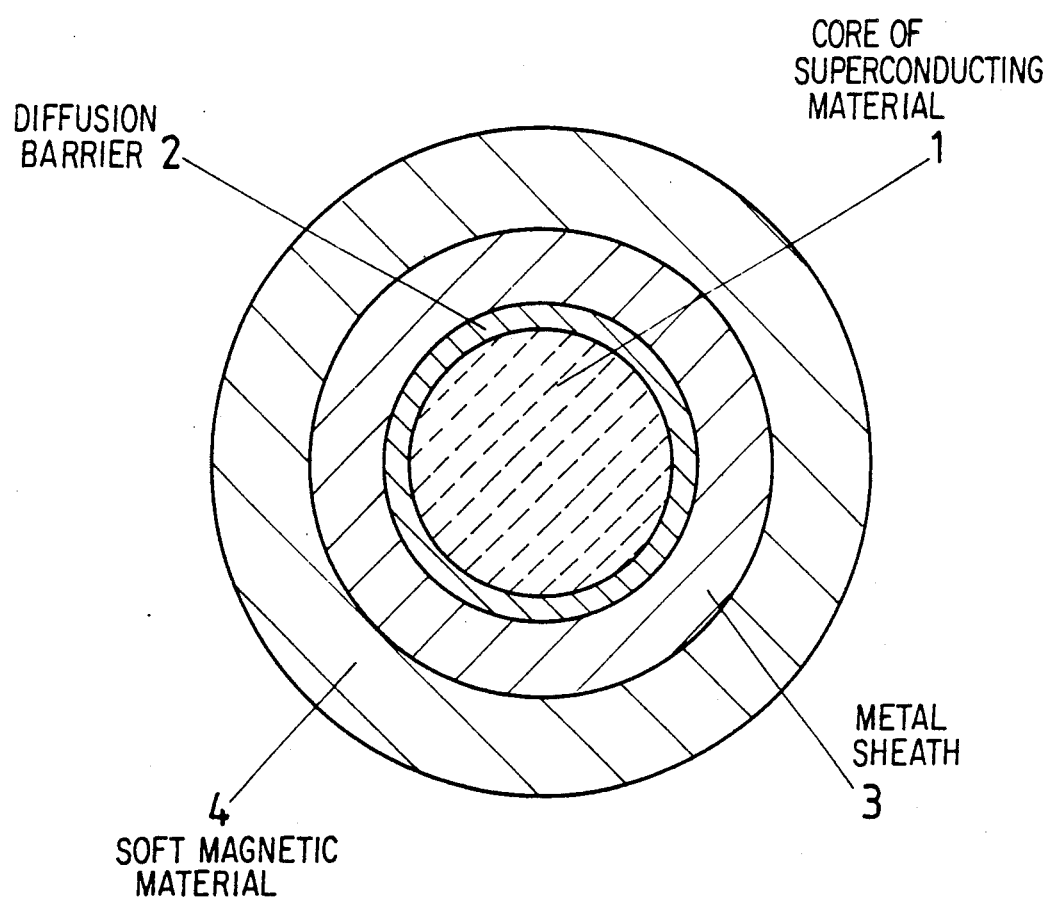
FIG. 1 shows a diagrammatic cross section through a wire (basic structure)

Referring now to the drawings, wherein like reference numerals designate identical or corresponding parts throughout the several views, FIG. 1 shows a diagrammatic cross section through a wire (basic structure) in the final state, i.e. after the rolling, forging, swaging, drawing etc. 1 is the core of superconducting material, for example of ceramic of the type $REBa_2Cu_3O_{6.5+y'}$ where RE=rare-earth metal and $0 < y < 1$. 2 is a diffusion barrier which may be composed of tantalum, niobium, vanadium, nickel etc. and largely prevents the migration of oxygen out of the core material (superconductor body 1). Of course, the diffusion barrier 2 may also be composed of an alloy of at least two of these elements. 3 is a metal sheath, e.g. a copper or silver tube which serves as mechanical support for maintaining the geometrical shape and as electrical emergency current conductor. 4 is a soft magnetic material of high permeability which encloses the core 1 and the metal sheath 3 concentrically and which, as it were, "sucks" the self-magnetic field of the conductor carrying an electric current into itself.

FIG. 2 shows a diagrammatic cross section through a multiple-filament conductor. This is a bundle of parallel fibres whose basic structure corresponds to that of FIG. 1. The reference symbols are precisely the same as those of the latter figure. The individual conductos are firmly embedded in the soft magnetic material 4.

Exemplary Embodiment 1

See FIGS. 1 and 2.

A composition which corresponded to the formula $YBa_2Cu_3O_7$;

was chosen for the core 1 of superconducting material.

For this purpose, a hollow-cylindrical metal sheath 3 in the form of a copper tube having 5 mm inside diameter and 8 mm outside diameter (1.5 mm wall thickness) was provided internally with a 200 μm thick nickel layer as diffusion barrier 2. The copper tube was then filled with a powder mixture which had the following quantity ratio:

| | |
|---|---|
| 1 Mol | $Y_2O_3$ |
| 3 Mol | BaO |
| 1 Mol | $BaO_2$ |
| 6 Mol | CuO |

Holes of 8 mm diameter were drilled at a distance of 12 mm in a prismatic block of soft magnetic material 4 (in this case soft steel). Tube sections filled with the powder mixture were now inserted into these holes. The prismatic steel block was reduced by grooved rolls to approx. 1/16 of its original cross section, the holes filled with superconducting material 1 still having a diameter of approx. 1.25 mm. Then the rod of approx. 50 mm diameter produced in this way was reduced gradually in its diameter to 5 mm by repeated drawing and, after repeated intermediate annealing, was drawn down to a wire of 1 mm diameter. The individual filaments had then assumed a diameter of approx. 25 μm. After the final shaping, the wound wire was placed in an installation for hot isostatic pressing which was flooded with argon. The pressure was increased to 200 bar and the temperature gradually raised to 930° C. during a time of 10 h. This condition was held for 4 h, then the multiple-filament conductor was cooled to room temperature at a rate of 25° C/h. The annealing treatment formed the superconducting compound $YBa_2Cu_3O_7$, as a result of the reactive sintering.

Comparison with a compact superconductor of 1 mm diameter without soft-magnetic embedding material yielded the following picture:

the current-carrying capacity of the compact wire was approx. 5 A, which corresponded to a critical current density of approx. 600A/cm$^2$. On the other hand, the current-carrying capacity of the multiple-filament conductor was approx. 20 A, which therefore corresponds to 4 times the current density of the unprotected material. In this connection, the following considerations may hold good:

recent researches show that the strong magnetic-field dependence is a factor which limits the critical current. The material loses its superconducting properties if the self-magnetic field H of the current exceeds a critical value which is typically 20 oersted. From this it follows that a filament can carry a current density $j_{crit}$ which is the greater, the smaller the radius R, since the maximum self-field is $$H = j_{crit} \cdot \frac{2\pi}{C} \cdot R.$$

This is found experimentally. A similar consideration shows that thin films are also able to transport higher current densities than thick films.

The electric field in a filament is made up of the self-field $H_e$ and the total field $H_g$ of the other filaments. $H_g$ is a maximum at the periphery of the cable and is 200 oersted at that point. The magnetic screening reduces this value by a factor which is approximately μ/5 (μ is the permeability of the magnetic material) for the present geometry. For soft steel, this results in a typical value μ/5 =20 for H=200 oersted, i.e. $H_g$ is 10 oersted in the filament. The self-field remains to be calculated: for a total current of 20 A, each filament has to carry a current of 16 mA. For a filament diameter of 25 μm results in a field of 4 oersted. The maximum field is therefore never greater than 10+4=14 oersted.

Exemplary Embodiment 2

See FIGS. 1 and 2.

A composition which corresponded to the formula $$YBa_2Cu_3O_{7+x} \text{ where } -0.5<x<0.1$$

was chosen for the core 1 of superconducting material. Oxide powders were used as starting materials. The powder mixture had the following quantity ratio:

| | |
|---|---|
| 1 Mol | $Y_2O_3$ |
| 2 Mol | BaO |
| 2 Mol | $BaO_2$ |
| 6 Mol | CuO |

This would correspond to a hypothetical compound of the formula $$YBa_2Cu_3O_{7.5}.$$

A silver tube of 5 mm inside diameter and 9 mm outside diameter (2 mm wall thickness) which served as metal sheath was provided internally with a 20 μm thick tantalum layer as diffusion barrier 2 and inserted into a nickel tube 4 of 9 mm inside diameter and 13 mm outside diameter. Then seven tubes were assembled to form a bundle (bundle diameter approx. 39 mm). The tubes were filled with the powder mixture and the entire bundle was reduced to a diameter of approx. 5 mm by grooved rolls at 850° C. In this process, the nickel tubes welded to form a compact body which formed the magnetic material 4. The bundle was then reduced to a diameter of 1 mm by repeated drawing with intermediate annealing. Seven such bundles were again combined in each case and drawn down to a diameter of 1 mm. Then seven of the last bundle were again combined and drawn down to a final diameter of approx. 1.4 mm. The individual filaments still had a diameter of approx. 20 μm. The multiple-filament conductor was then converted to the final wound form and subjected to a reactive sintering process. The annealing took place in an oxygen atmosphere at 1000 bar for 8 h at a temperature of 920° C. Then cooling was first carried out slowly down to 500° C. followed by rapid cooling to room temperature. Investigation showed that the multiple-filament conductor had a current-carrying capacity which corresponded to a critical current density of approx. 2500 A/cm$^2$.

The statements made under Example 1 are valid for the considerations.

The invention is not limited to the exemplary embodiments. In principle, the electrical conductor in wire or cable form is composed of sheathed wire or of a multiple-filament conductor based on a ceramic high-temperature superconductor of the $REBa_2Cu_3O_{6.5+y}$ type, RE denoting a rare-earth metal and $0<y<1$, or of the $(La,Ba, Sr)_2CuO_4$ type, and the said superconductor being arranged as core in a metal sheath serving as mechanical support and emergency current conductor, the core, provided with the metal sheath, of each filament of the electrical conductor, which is resolved into a plurality of filaments, being embedded in a soft magnetic material of high permeability. Fe, Ni and/or their alloys are suitable for the latter, but the permeability should be at least 10, while the saturation of the magnetic induction is at least 0.2 tesla.

The electrical conductor is formed as multiple-filament conductor having a diameter of the individual cores of 2 to 200 $\mu$m, which cores have a common embedding, closed on all sides, in the form of a continuous soft magnetic material.

A diffusion barrier for oxygen is advantageously incorporated between metal sheath and core.

The advantage of the invention is the increase in the critical limiting current density by a factor of 4 compared with unscreened wire-type or cable-type high-temperature superconductors. The current-carrying capacity is also substantially increased in the case of alternating current operation by the magnetic screening.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. An electrical conductor in wire or cable form, comprising:
   a plurality of filamentary conductors each comprising a core of a ceramic high-$T_c$ superconducting material, said core being sheathed with a metal sheath which serves as mechanical support and emergency current conductor;
   wherein each of said filamentary conductors is separately embedded in and surrounded by a common matrix made of a soft magnetic material having a permeability of at least 10 and a saturation of magnetic induction of at least 0.2 tesla.

2. The electrical conductor as claimed in claim 1, wherein said ceramic high-$T_c$ superconducting material is of the $REBa_2Cu_3O_{6.5+y}$ type, RE denoting a rare earth metal and $0<y<1$, or of the $(La,Ba,Sr)_2CuO_4$ type.

3. The electrical conductor as claimed in claim 1, wherein each of said cores has a diameter of 2 to 200 $\mu$m.

4. The electrical conductor as claimed in claim 1, wherein said soft magnetic material is composed of iron, nickel or an iron or nickel alloy.

5. The electrical conductor as claimed in claim 1, wherein each of said filamentary conductors comprises a diffusion barrier for oxygen separating said core and said metal sheath.

6. An electrical conductor in wire or cable form, comprising:
   a plurality of filamentary conductors each comprising a core of a ceramic high-$T_c$ superconducting material of the $REBa_2Cu_3O_{6.5+y}$ type, RE denoting a rare earth metal and $0<y<1$, or of the $(La,Ba,Sr)_2CuO_4$ type, said core having a diameter of 2 to 200 $\mu$m and being sheathed with a metal sheath which serves as mechanical support and emergency current conductor;
   wherein each of said filamentary conductors is separately embedded in and surrounded by a common matrix made of a soft magnetic material composed of iron or nickel or an iron or nickel alloy having a permeability of at least 10 and a saturation of magnetic induction of at least 0.2 tesla.

7. The electrical conductor as claimed in claim 6, wherein each of said filamentary conductors comprises a diffusion barrier for oxygen separating said core and said metal sheath.

8. An electrical conductor in wire or cable form, comprising:
   a plurality of filamentary conductors each comprising a core of a ceramic high-$T_c$ superconducting material of the $REBa_2Cu_3O_{6.5+y}$ type, RE denoting a rare earth metal and $0<y<1$, or of the $(La,Ba,Sr)_2CuO_4$ type, said core having a diameter of 2 to 200 $\mu$m and being sheathed with a metal sheath which serves as mechanical support and emergency current conductor;
   wherein each of said filamentary conductors is separately embedded in and surrounded by a common matrix made of a soft magnetic material comprised of iron or nickel or an iron or nickel alloy having a permeability of at least 10 and a saturation of magnetic induction of at least 0.2 tesla; and
   wherein each of said filamentary conductors comprises a diffusion barrier for oxygen separating said core and said metal sheath.

* * * * *